United States Patent
Neal et al.

(10) Patent No.: US 12,334,453 B2
(45) Date of Patent: *Jun. 17, 2025

(54) SOLDERED METALLIC RESERVOIRS FOR ENHANCED TRANSIENT AND STEADY-STATE THERMAL PERFORMANCE

(71) Applicant: Intel Corporation, Santa Clara, CA (US)

(72) Inventors: Nicholas Neal, Scottsdale, AZ (US); Nicholas S. Haehn, Mesa, AZ (US); Sergio Chan Arguedas, Chandler, AZ (US); Edvin Cetegen, Chandler, AZ (US); Jacob Vehonsky, Gilbert, AZ (US); Steve S. Cho, Chandler, AZ (US); Rahul Jain, Gilbert, AZ (US); Antariksh Rao Pratap Singh, Gilbert, AZ (US); Tarek A. Ibrahim, Mesa, AZ (US); Thomas Heaton, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/216,005

(22) Filed: Jun. 29, 2023

(65) Prior Publication Data

US 2023/0343723 A1 Oct. 26, 2023

Related U.S. Application Data

(63) Continuation of application No. 16/526,087, filed on Jul. 30, 2019, now abandoned.

(51) Int. Cl.
*H01L 23/00* (2006.01)
*H01L 23/367* (2006.01)
*H01L 23/538* (2006.01)

(52) U.S. Cl.
CPC ........ *H01L 23/562* (2013.01); *H01L 23/3675* (2013.01); *H01L 23/5381* (2013.01)

(58) Field of Classification Search
CPC .............. H01L 23/562; H01L 23/3675; H01L 23/5381; H01L 2924/16153
(Continued)

(56) References Cited

U.S. PATENT DOCUMENTS

2008/0218971 A1 9/2008 Coico
2012/0206882 A1* 8/2012 Mohammed ........ H01L 23/3735
977/932

(Continued)

OTHER PUBLICATIONS

Office Action from U.S. Appl. No. 16/526,087, mailed Dec. 29, 2023, 13 pgs.
(Continued)

*Primary Examiner* — Quoc D Hoang
(74) *Attorney, Agent, or Firm* — Schwabe, Williamson & Wyatt P.C.

(57) ABSTRACT

Embodiments disclosed herein include electronic packages with thermal solutions. In an embodiment, an electronic package comprises a package substrate, a first die electrically coupled to the package substrate, and an integrated heat spreader (IHS) that is thermally coupled to a surface of the first die. In an embodiment, the IHS comprises a main body having an outer perimeter, and one or more legs attached to the outer perimeter of the main body, wherein the one or more legs are supported by the package substrate. In an embodiment, the electronic package further comprises a thermal block between the package substrate and the main body of the IHS, wherein the thermal block is within the outer perimeter of the main body.

20 Claims, 10 Drawing Sheets

(58) Field of Classification Search
USPC .......................................................... 257/713
See application file for complete search history.

(56) References Cited

U.S. PATENT DOCUMENTS

| | | |
|---|---|---|
| 2013/0043581 A1 | 2/2013 | Negoro |
| 2013/0134574 A1 | 5/2013 | Ihara |
| 2016/0233141 A1* | 8/2016 | Hirobe .................... H01L 23/04 |
| 2018/0374773 A1 | 12/2018 | Kurosawa |
| 2020/0083136 A1* | 3/2020 | Dry ....................... H01L 23/298 |
| 2021/0035921 A1* | 2/2021 | Neal ................... H01L 23/5385 |

OTHER PUBLICATIONS

Office Action from U.S. Appl. No. 16/526,087, mailed Sep. 13, 2023, 12 pgs.
Final Office Action from U.S. Appl. No. 16/526,087, mailed Apr. 24, 2024, 12 pgs.

* cited by examiner

SOLDERED METALLIC RESERVOIRS FOR ENHANCED TRANSIENT AND STEADY-STATE THERMAL PERFORMANCE

CROSS-REFERENCE TO RELATED APPLICATIONS

This application is a continuation of U.S. patent application Ser. No. 16/526,087, filed on Jul. 30, 2019, the entire contents of which is hereby incorporated by reference herein.

TECHNICAL FIELD

Embodiments of the present disclosure relate to semiconductor devices, and more particularly to electronic packages with a metallic reservoir attached to the heat spreader to provide improved thermal performance.

BACKGROUND

Thermal interface materials (TIMs) are used to transfer the heat from one object to another. In lidded electronics cooling packages, TIM is applied to the die surface to reduce contact resistance between the die and the integrated heat spreader (IHS). The IHS may also be referred to as a lid in some instances. TIMs are subject to many stresses caused by external factors, such as dynamic warpage, thermal cycling, heat, and moisture, to name a few. These stresses are especially severe for multi-chip-packages (MCPs) and large dies on organic packages. Such repeated stresses over the life of a product may result in damage to the TIM in the form of cracks, voids, and delaminations.

As electronics manufacturing continues to reduce transistor size and density, power per unit area of active silicon is increasing. This, combined with increasingly complicated packaging technology, has led to the requirement of more effective cooling solutions with more emphasis on high performance and non-traditional cooling.

Furthermore, transient performance of client applications has become a primary focus for thermal control. Applications such as mobile phones, personal computers, and tablets tend to operate in relatively low power regimes with occasional bursts of extreme power that lasts for a short duration of time. Accordingly, thermal solutions are needed that accommodate steady state low power conditions as well as short high power conditions.

EMBODIMENTS OF THE PRESENT DISCLOSURE

Figure 1A:
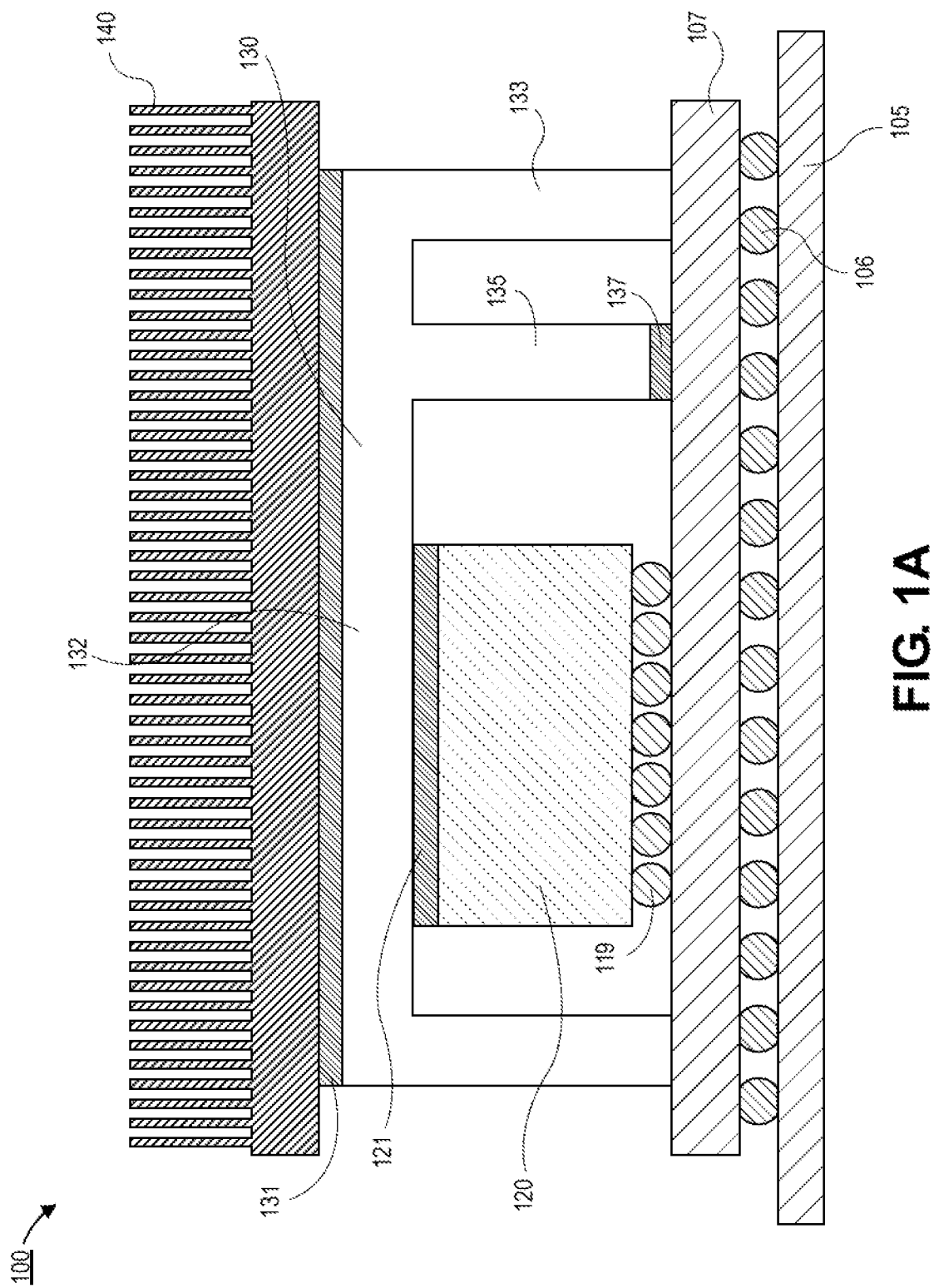
FIG. 1A is a cross-sectional illustration of an electronic package with an integrated heat spreader (IHS) and a thermal block, in accordance with an embodiment.

Described herein are electronic packages with a metallic reservoir attached to the heat spreader to provide improved thermal performance, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, thermal solutions are needed to accommodate ever increasing power densities, especially in complex multi-chip-packages (MCPs). The complexity of such packaging architectures also increases demand for warpage reduction. In the past dummy silicon dies have been disposed proximate to high stress areas in order to reduce the stresses in a particular area. However, the use of dummy silicon is expensive and area intensive. Furthermore, silicon has a low thermal conductivity. As such, the dummy silicon dies do not significantly improve the thermal performance of the electronic package. Another solution to reduce warpage is to over mold the dies. However, such processes are expensive, and the mold material has a low thermal conductivity.

Accordingly, embodiments disclosed herein include a thermal solution that also provides improvements in warpage control. Particularly, thermal blocks may be positioned adjacent to one or more of the dies in an electronic package. The thermal blocks increase the stiffness proximate to high stress areas, and therefore, minimize warpage in the targeted area. Additionally, the thermal blocks are thermally coupled to the dies in order to provide improved thermal control. For example, the thermal blocks may be coupled to the integrated heat spreader (IHS). The thermal block functions as a reservoir of thermally conductive material and increases the effective thermal mass of the IHS. Accordingly, thermal blocks are able to improve the thermal performance during transient burst operation and during steady state operation.

With respect to transient burst operations, thermal blocks in accordance with embodiments disclosed herein provide a high-conductivity, high thermal mass region that slows down a thermal wave during the transient burst event. The use of thermal blocks also provide benefits during steady state operation. For example, the increase in the thermal mass provides additional heat spreading (which is especially helpful for thin lids). Additionally, the thermal blocks provide alternative heat transfer paths to the primary cooling solution (e.g., a heat sink). For example, heat may travel into the package substrate and up the thermal block to the IHS instead of passing from the die directly to the IHS. This is particularly beneficial in components with high thermal resistances, such as memory devices.

Referring now to FIG. 1A, a cross-sectional illustration of an electronic package 100 is shown, in accordance with an embodiment. In an embodiment, the electronic package 100 may comprise a board 105 and a package substrate 107 coupled to the board 105. The board 105 may be a motherboard a printed circuit board (PCB) or the like. In an embodiment, the package substrate 107 is coupled to the board 105 by interconnects 106. The interconnects 106 are shown as solder bumps, but it is to be appreciated that the interconnects 106 may be implemented using any suitable interconnect architecture. In an embodiment, the package substrate 107 comprises a plurality of dielectric layers (e.g., buildup film or the like) with conductive features (e.g., traces, vias, pads, etc.) embedded in the dielectric layers. The individual layers and conductive features are omitted from FIG. 1 for simplicity.

In an embodiment, a die 120 may be coupled to the package substrate 107. In an embodiment, the die 120 may be coupled to the package substrate by interconnects 119. For example, the interconnects 119 may be first level interconnects (FLIs), and may comprise solder, copper bumps, and/or the like. In an embodiment, the die 120 is any type of die that includes active circuitry (e.g., transistors and the like). For example, the die 120 may be a processor die, a graphics die, a memory die, or the like.

In an embodiment, the die 120 may be thermally coupled to an integrated heat spreader (IHS) 130. In some embodiments, the IHS 130 may also be referred to as a lid. The IHS 130 may comprise a main body 132 and one or more legs 133 that extend away from the main body 132. In an embodiment, the legs 133 may be located along an outer perimeter of the main body 132. That is, the legs 133 may be located at the edges of the main body 132. In an embodiment, the IHS 130 may be any material that has a relatively high thermal conductivity. For example, the IHS 130 may be copper, or another metal. In some embodiments, the IHS 130 may have a layer plated over the base material. For example, a nickel layer may be plated over a copper core.

In an embodiment, the die 120 may be separated from the IHS by a thermal interface material (TIM) 121. In an embodiment, the TIM 121 may be any suitable TIM, such as a solder TIM, a polymer TIM, or the like. The TIM 121 reduces the contact resistance between the die 120 and the IHS 130 in order to promote heat transfer from the die 120 into the IHS 130.

In an embodiment, the IHS 130 may be thermally coupled to a primary cooling solution 140. For example, the primary cooling solution 140 may be a heat sink or the like. In an embodiment, the primary cooling solution 140 may have a plurality of fins or the like. In an embodiment, the primary cooling solution 140 may be thermally coupled to the IHS 130 by a second TIM 131. The second TIM 131 may be a different material than the first TIM 121. In other embodiments, the second TIM 131 may be the same as the first TIM 121.

In an embodiment, the electronic package 100 may further comprise a thermal block 135. The thermal block 135 may be positioned adjacent to the die 120. In an embodiment, the thermal block 135 is positioned within an outer perimeter of the IHS 130. For example, the thermal block 135 may be within a perimeter defined by the one or more legs 133. In a particular embodiment, the thermal block 135 may be positioned proximate to high stress regions of the die 120. Accordingly, the thermal block 135 may provide warpage reduction targeted to high stress areas of the die 120.

The thermal block 135 may also improve thermal performance of the electronic package 100. For example, the thermal block 135 may comprise a high thermal conductivity material, such as copper or the like. The additional mass of the thermal block 135 increases the effective thermal mass of the IHS 130. With respect to transient burst operations, the thermal block 135 provides a high-conductivity, high thermal mass region that slows down a thermal wave during the transient burst event. The use of a thermal block 135 also provide benefits during steady state operation. For example, the increase in the thermal mass provides additional heat spreading (which is especially helpful for a thin IHS 130). Additionally, the thermal block 135 provides alternative heat transfer paths to the primary cooling solution 140 (e.g., a heat sink). For example, heat may travel into the package substrate 107 and up the thermal block 135 to the IHS 130 instead of passing from the die 120 directly to the IHS 130. This is particularly beneficial when the die 120 has a relatively high thermal resistance, such as memory devices.

In the illustrated embodiment, the thermal block 135 is shown as being a part of the IHS 130. That is, the thermal block 135 and the IHS 130 are formed from a single substrate (e.g., the thermal block 135 may be an extruded feature from the main body 132). However, it is to be appreciated that the thermal block 135 need not be integrated with the IHS 130 as a single component, as will be described in greater detail below.

In an embodiment, the thermal block 135 may be secured to the package substrate 107. For example, a solder 137 or the like may be used to secure the thermal block 135 to the package substrate 107. In an embodiment, the thermal block 135 is secured to a conductive pad or plane (not shown) on the package substrate 107. Despite being connected to conductive features of the package substrate 107, it is to be appreciated that no operating signals pass over the pads and/or planes that ae coupled to the thermal block 135. That is, the thermal block 135 is electrically isolated from circuitry of the electronic package 100. While not limited to use for any particular purpose, it is to be appreciated that the thermal block 135 is particularly useful for warpage reduction and improvement of thermal performance.

Figure 1B:
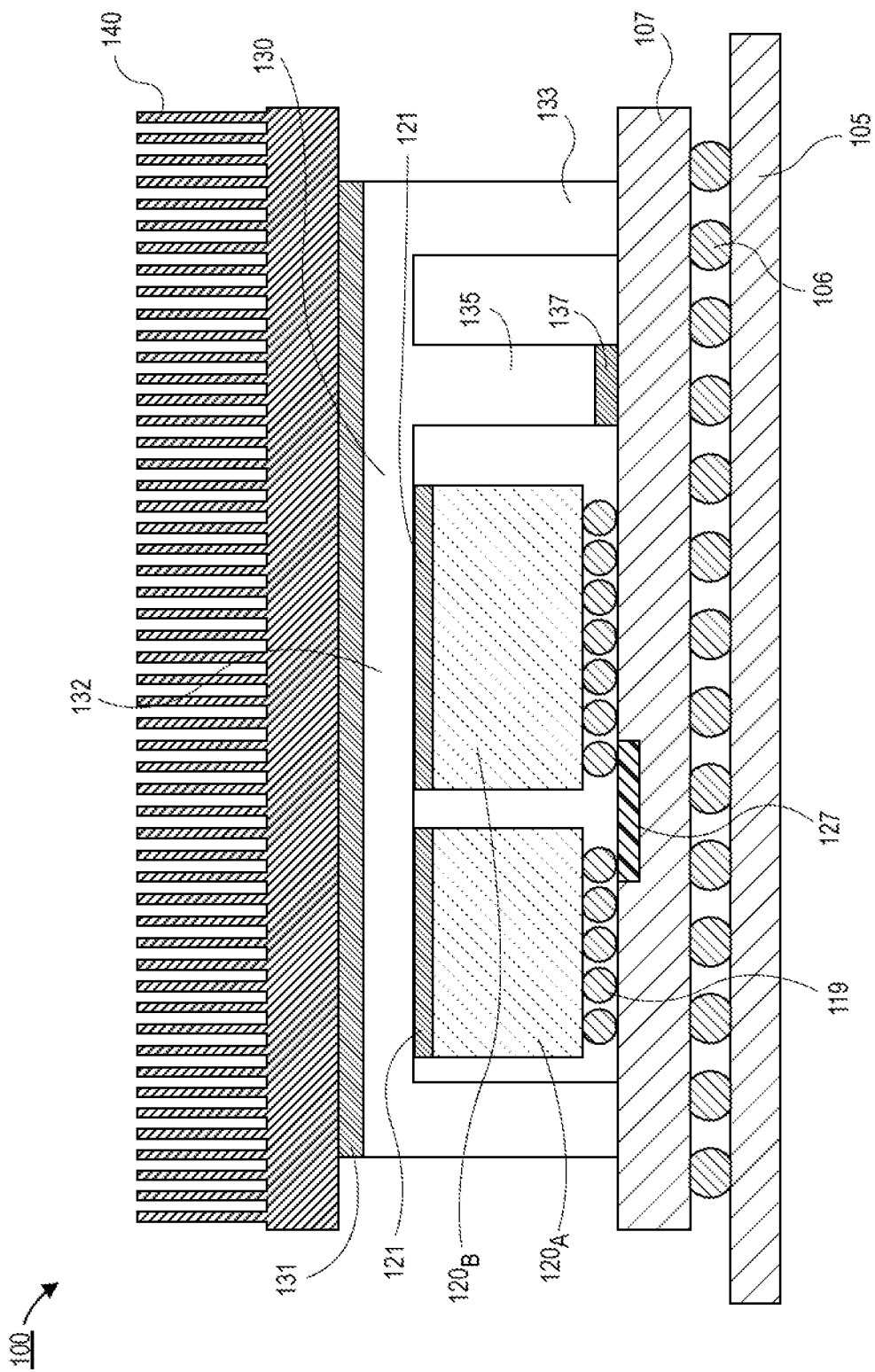
FIG. 1B is a cross-sectional illustration of an electronic package with a plurality of dies, an IHS, and a thermal block, in accordance with an embodiment.

Referring now to FIG. 1B, a cross-sectional illustration of an electronic package 100 is shown, in accordance with an additional embodiment. In an embodiment, the electronic package 100 in FIG. 1B is substantially similar to the electronic package 100 in FIG. 1A, with the exception that a first die 120A and a second die 120E are attached to the package substrate 107. In an embodiment, the second die 120E may be electrically coupled to the first die 120A by a bridge 127 that is embedded in the package substrate 107. For example, the bridge 127 may be an embedded multi-die interconnect bridge (EMIB) or the like.

In an embodiment, the thermal block 135 may be adjacent to the second die 120B. In some embodiments, a single thermal block 135 is included in the electronic package 100. For example, a second edge of the second die 120E (e.g., the edge opposite from the thermal block 135) may not require an additional thermal block since the first die 120A provides mechanical stiffening of the electronic package 100 that is similar to the stiffening provided by the thermal block 135. However, it is to be appreciated that any number of thermal blocks 135 may be included in the electronic package 100.

Figure 2A:
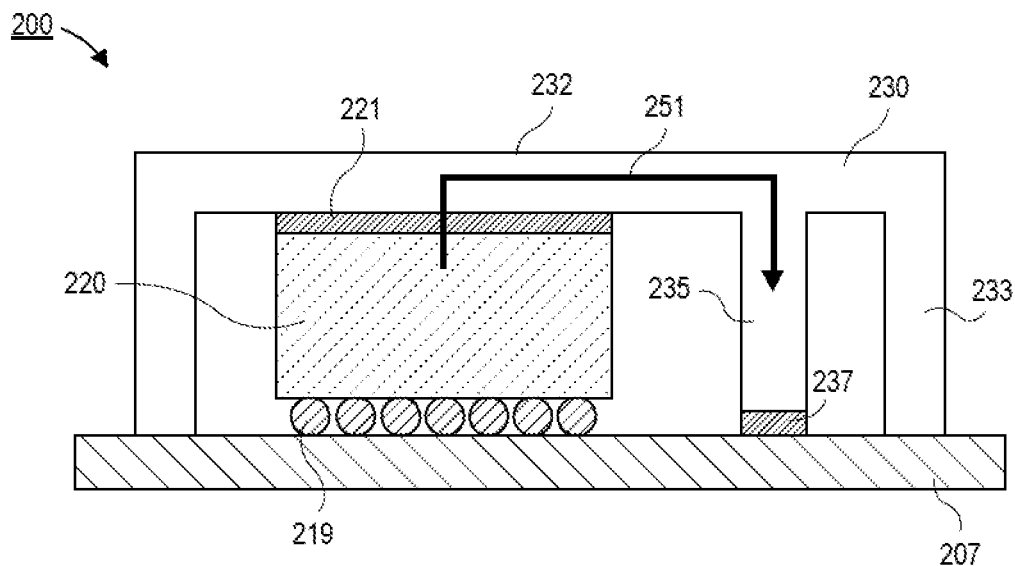
FIG. 2A is a cross-sectional illustration of an IHS over a die and a package substrate that illustrates a first thermal path, in accordance with an embodiment.
Figure 2B:
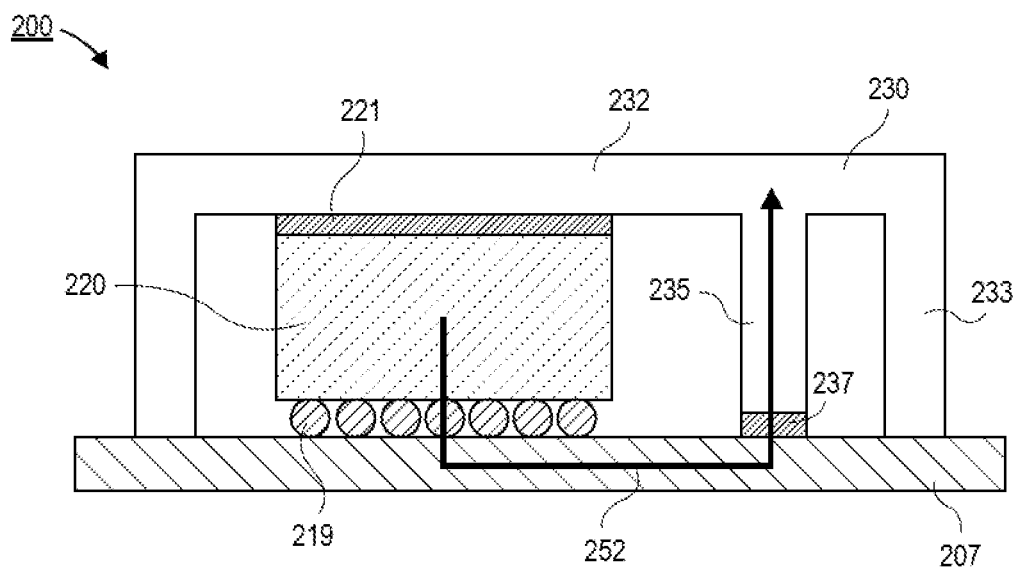
FIG. 2B is a cross-sectional illustration of an IHS over a die and a package substrate that illustrates a second thermal path, in accordance with an embodiment.

Referring now to FIGS. 2A and 2B, cross-sectional illustrations of a portion of an electronic package 200 are shown in accordance with an embodiment. In an embodiment, the electronic package 200 comprises a package substrate 207 and a die 220 attached to the package substrate 207 by interconnects 219. In an embodiment, an IHS 230 is thermally coupled to the die 220 by a TIM 221. Legs 233 and a thermal block 235 may extend out from a main body 232 of the IHS 230 and contact the package substrate 207.

The electronic packages in FIGS. 2A and 2B illustrate thermal path 251 (FIG. 2A) and thermal path 252 (FIG. 2B). In an embodiment, the thermal path 251 passes up through the TIM 221 and into the main body 232 of the IHS 230. The thermal path then extends down into the thermal block 235. Such a thermal path 251 is particularly beneficial when the main body 232 of the IHS 230 is relatively small. The extra thermal mass provided by the thermal block 235 allows for improvement in the thermal performance of the electronic package 200. For example, the high thermal mass of the thermal block 235 slows down a thermal wave during the transient burst event. The use of a thermal block 235 also provides benefits during steady state operation. For example, the increase in the thermal mass provides additional heat spreading capabilities.

In FIG. 2B, the thermal path 252 starts in the die 220 and extends down through an interconnect 219 and into the package substrate 207. In an embodiment, the thermal path 252 may then extend up to the thermal block 235. In an embodiment, the thermal path 252 may pass through an interconnect 237 that couples the thermal block 235 to the package substrate 207. This alternative thermal path 252 allows for the heat to bypass the die 220 (or at least partially bypass the die 220 as some heat will still traverse the thickness of the die 220) on the way to the primary thermal solution (not shown in FIG. 2B). This is particularly beneficial when the die 220 has a high thermal resistance. For example, the thermal resistance is relatively high when the die 220 is a memory die.

FIGS. 2A and 2B illustrate two different thermal paths 251 and 252 that may be used in an electronic package 200 in accordance with embodiments disclosed herein. While the thermal paths 251 and 252 are shown in different Figures, it is to be appreciated that thermal paths 251 and 252 (and additional thermal paths that are not shown) may be implemented in a single electronic package 200.

Referring now to FIGS. 3A-3D, a series of plan view illustrations depict electronic packages 300 that implement thermal blocks 335 in various configurations. In FIGS. 3A-3D, the plan view illustrations depict a package substrate 307 and a die 320. While a single die 320 is shown on the package substrate 307, it is to be appreciated that embodiments include any number of dies 320 in the electronic packages 300. In an embodiment, legs 333 of an IHS are shown as a single structure that forms an outer perimeter 338 of the IHS. The main body of the IHS is omitted in order to not obscure the features highlighted in FIGS. 3A-3D. However, it is to be appreciated that the die 320, the legs 333, and the thermal block (or blocks) 335 are thermally coupled to a main body of the IHS that is positioned above the illustrated features (i.e., out of the plane of the page).

Figure 3A:
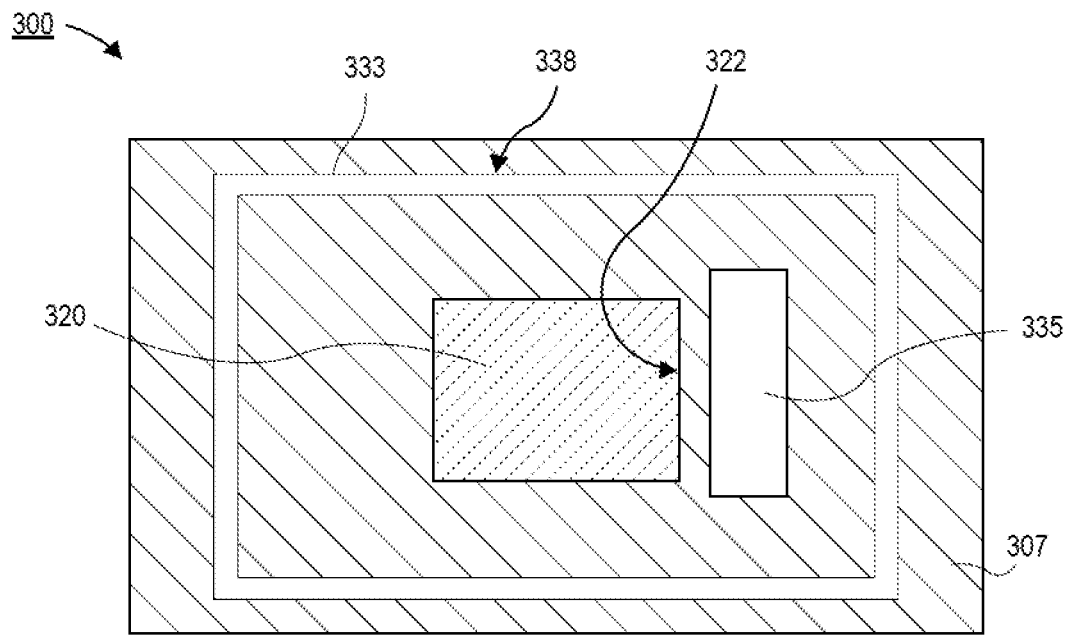
FIG. 3A is a plan view illustration of an electronic package with a first thermal block within a perimeter of an IHS, in accordance with an embodiment.

Referring now to FIG. 3A, a plan view illustration of an electronic package 300 is shown, in accordance with an embodiment. In an embodiment, the electronic package 300 comprises a die 320 with a first edge 322. In an embodiment, a thermal block 335 is positioned adjacent to the first edge 322 of the die 320 and within the outer perimeter 338 of the IHS. In an embodiment, the thermal block 335 is substantially rectangular in shape and has a length that is greater than a length of the first edge 322. However, it is to be appreciated that the thermal block 335 need not extend along the entire length of the first edge 322 of the die 320.

Figure 3B:
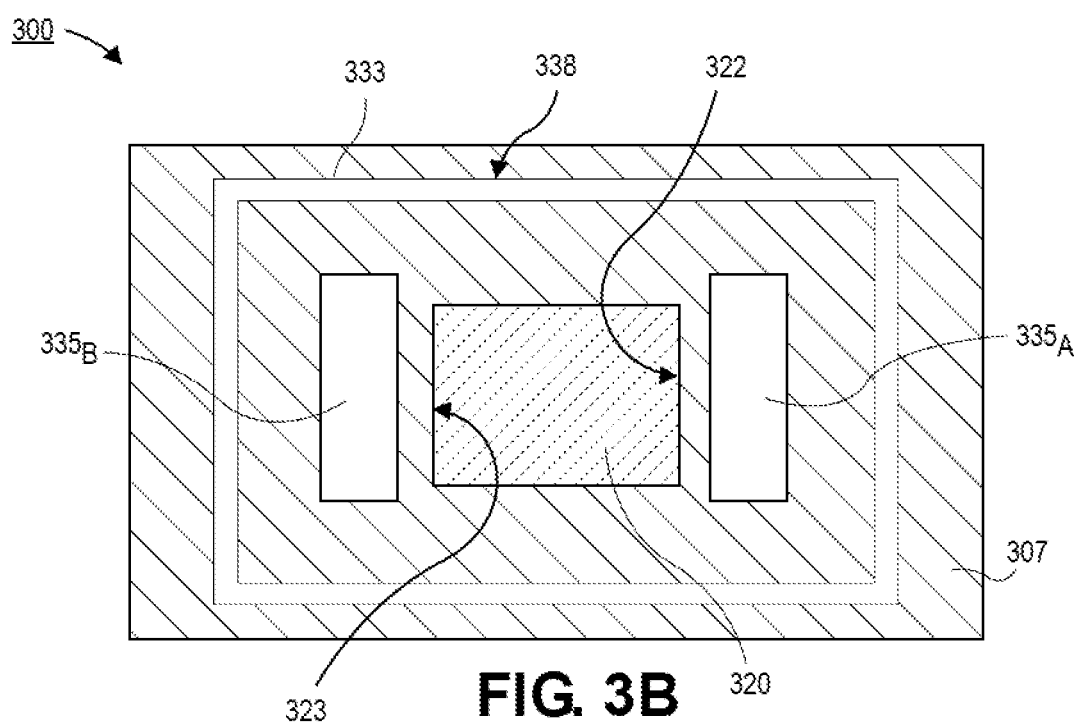
FIG. 3B is a plan view illustration of an electronic package with a first thermal block and a second thermal block within a perimeter of an IHS, in accordance with an embodiment.

Referring now to FIG. 3B, a plan view illustration of an electronic package 300 is shown, in accordance with an additional embodiment. In an embodiment, the electronic package 300 comprises a plurality of thermal blocks 335. For example, the electronic package 300 comprises a first thermal block 335A and a second thermal block 335B. In an embodiment, the first thermal block 335A may be adjacent to a first edge 322 of the die 320, and the second thermal block 335B may be adjacent to a second edge 323 of the die 320. In the illustrated embodiment, the first edge 322 is opposite from the second edge 323. However, it is to be appreciated that the first thermal block 335A and the second thermal block 335B may be positioned adjacent to any combination of edges of the die 320.

In the illustrated embodiment, the first thermal block 335A and the second thermal block 335B are substantially the same size. That is, the volume (and the thermal mass) of the first thermal block 335A and the second thermal block 335B may be substantially the same. However, it is to be appreciated that embodiments are not limited to such configurations. For example, the first thermal block 335A may be larger or smaller than the second thermal block 335B. Such configurations may be useful for when hotspots across the die 320 are not uniform. For example, there may be more hot spots (or the hotspots may be more severe) proximate to the first edge 322 than proximate to the second edge 323.

Figure 3C:
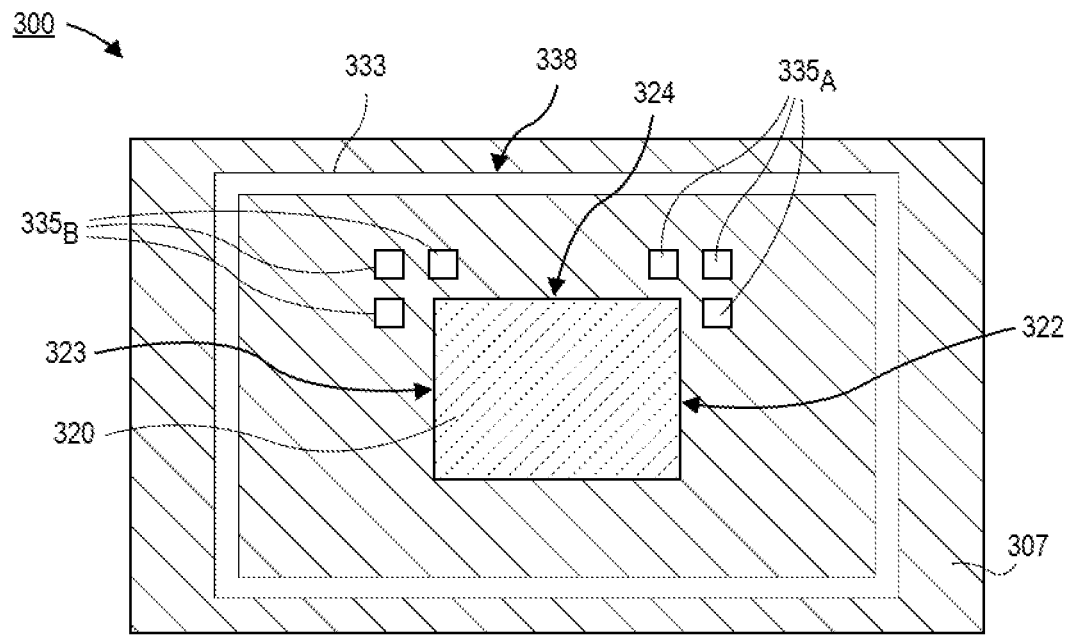
FIG. 3C is a plan view illustration of an electronic package with a plurality of thermal blocks within a perimeter of an IHS, in accordance with an embodiment.

Referring now to FIG. 3C, a plan view illustration of an electronic package 300 is shown, in accordance with an additional embodiment. In an embodiment, the electronic package 300 may comprise a plurality of first thermal blocks 335A and a plurality of second thermal blocks 335B. The thermal blocks 335A and 335B illustrated in FIG. 3C are substantially square shaped, though any shape may be used in accordance with various embodiments. Particularly, the thermal blocks 335A and 335B may be referred to as pillars. That is, the length dimension and width dimension (visible in the plane shown in FIG. 3C) may be smaller than a thickness dimension (out of the plane shown in FIG. 3C). In an embodiment, the first thermal blocks 335A and the second thermal blocks 335B may be arranged adjacent to one or more edges of the die 320. For example, the first thermal blocks 335A are positioned adjacent to a first edge 322 and a third edge 324, and the second thermal blocks 335B are adjacent to a second edge 323 and the third edge 324.

Figure 3D:
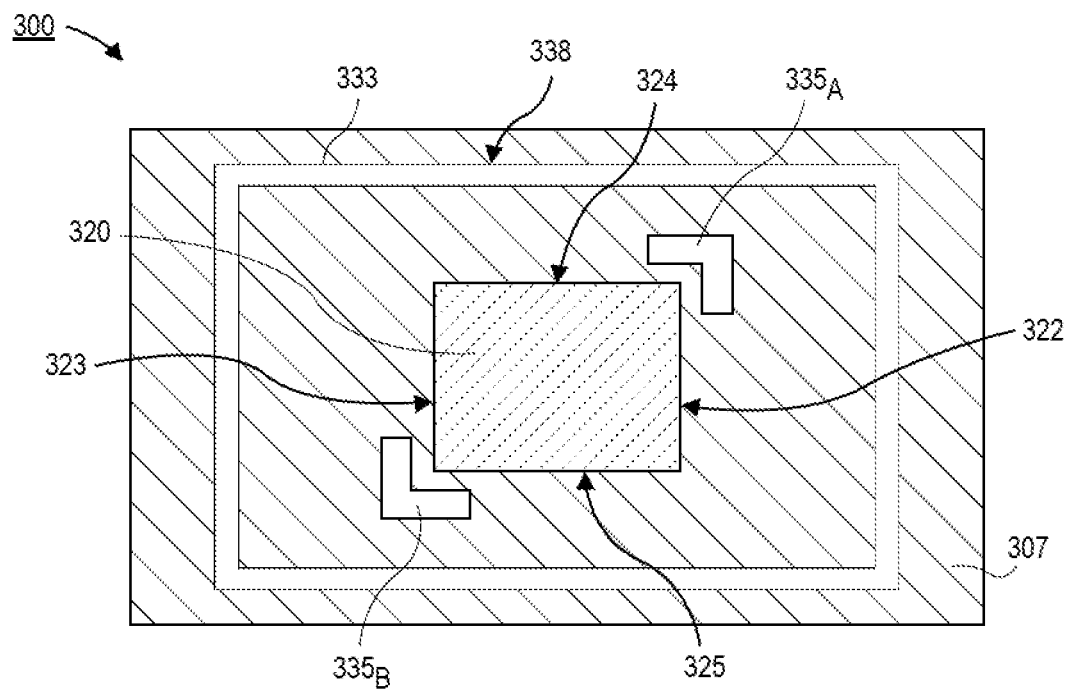
FIG. 3D is a cross-sectional illustration of an electronic package with a plurality of L-shaped thermal blocks, in accordance with an embodiment.

Referring now to FIG. 3D, a plan view illustration of an electronic package 300 is shown, in accordance with an additional embodiment. In an embodiment, the electronic package 300 comprises a plurality of thermal blocks 335 that have non-rectangular cross-sections (as viewed from above). For example, a first thermal block 335A and a second thermal block 335B may have substantially L-shaped cross-sections, as shown in FIG. 3D. The L-shaped cross-sections allow for the thermal blocks 335A and 335B to wrap around corners of the die 320. For example, the first thermal block 335A wraps around a corner that connects a first edge 322 to a third edge 324, and the second thermal block 335B wraps around a corner that connects a second edge 323 to a fourth edge 325.

While the first thermal block 335A and the second thermal block 335B are both shown as having L-shaped cross-sections, it is to be appreciated that embodiments may include any suitable combination of thermal block shapes. For example, a first thermal block 335A may have an L-shaped cross-section and a second thermal block 335B may have a rectangular cross-section.

Referring now to FIGS. 4A-4D, a series of cross-sectional illustrations of a portion of an electronic package 400 are shown, in accordance with various embodiments. The illustrated portions of the electronic packages 400 depict the position of the thermal block 435 in relation to the IHS 430 and the package substrate 407.

Figure 4A:
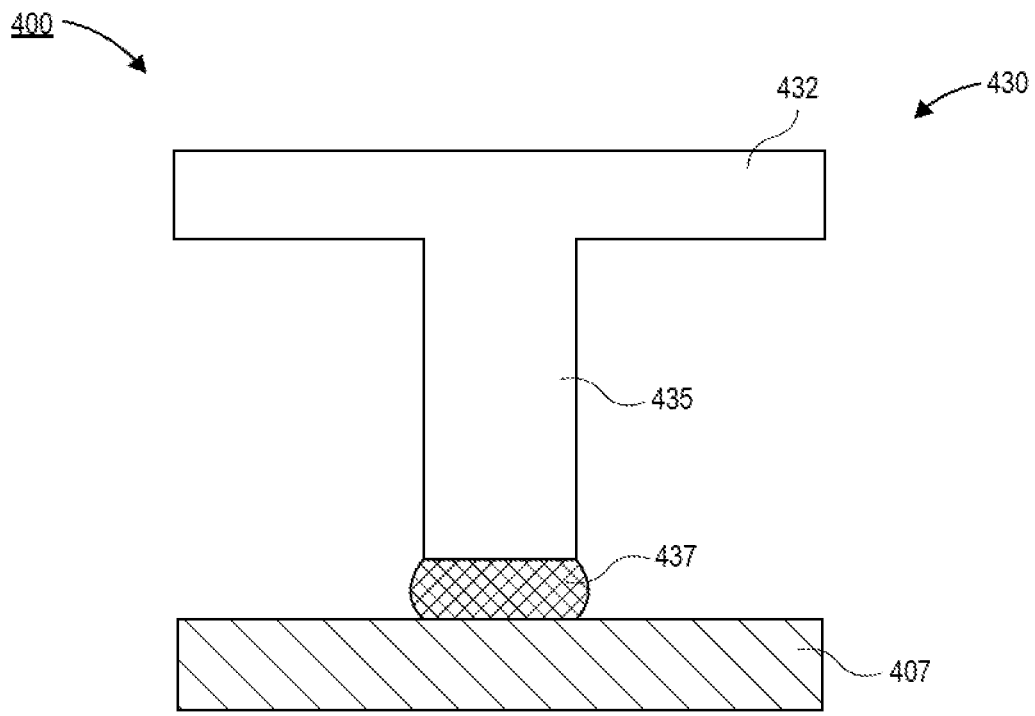
FIG. 4A is a cross-sectional illustration of a portion of an electronic package that shows a thermal block that is a monolithic part with the IHS, in accordance with an embodiment.

Referring now to FIG. 4A, a cross-sectional illustration of an electronic package 400 is shown, in accordance with an embodiment. In an embodiment, the electronic package 400 may comprise an IHS 430 that is coupled to a package substrate 407. For example, the main body 432 of the IHS 430 may be coupled to the package substrate by a thermal block 435 and a solder interconnect 437. In an embodiment, the thermal block 435 may be part of the IHS 430. That is, the thermal block 435 may be an extruded component from the main body 432.

Figure 4B:
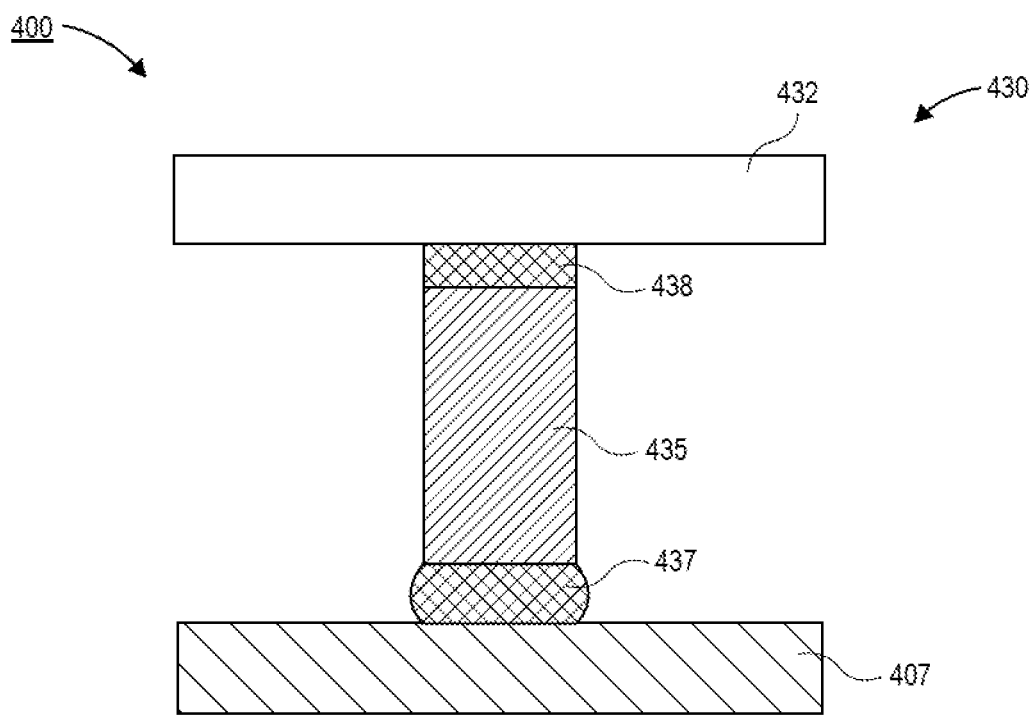
FIG. 4B is a cross-sectional illustration of a portion of an electronic package that shows a thermal block that is soldered to the package substrate and separated from the IHS by a thermal interface material (TIM), in accordance with an embodiment.

Referring now to FIG. 4B, a cross-sectional illustration of an electronic package 400 is shown, in accordance with an additional embodiment. In an embodiment, the electronic package 400 comprises an IHS 430 that is coupled to a package substrate 407. In an embodiment, a thermal block 435 may be positioned between the main body 432 of the IHS 430 and the package substrate 407. For example, the thermal block 435 may be a discrete component that is attached to the package substrate 407 (e.g., by using an solder interconnect 437). In an embodiment, the thermal block 435 may be thermally coupled to the main body 432 by a TIM 438. In an embodiment, the TIM 438 may be the same material used to thermally couple a die (not shown) to the IHS 430.

Figure 4C:
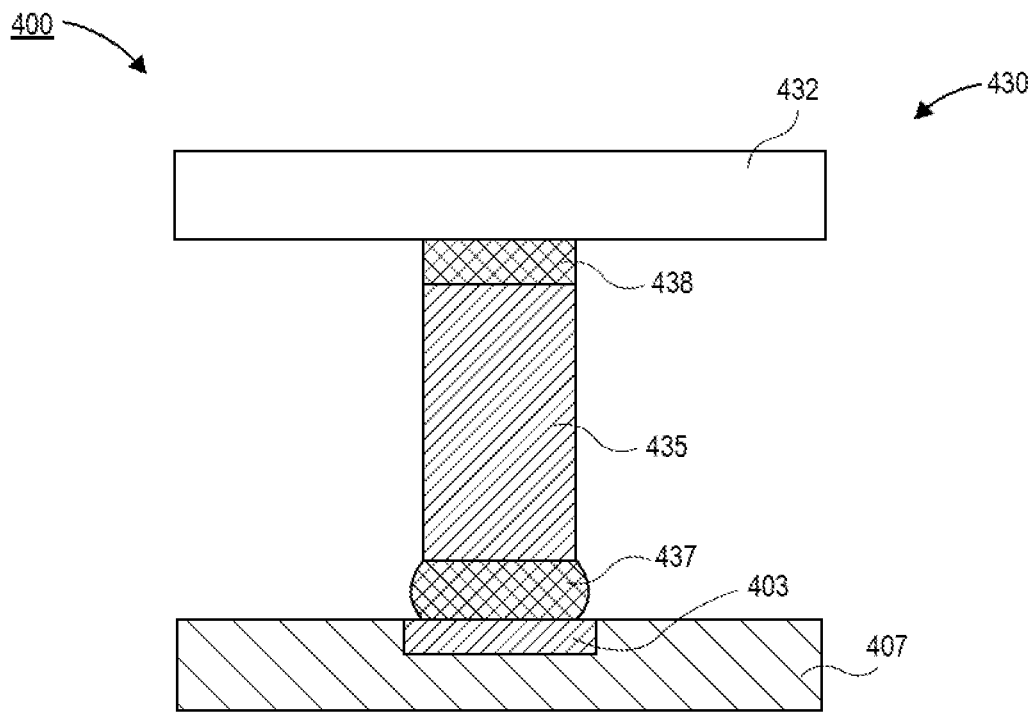
FIG. 4C is a cross-sectional illustration of a portion of an electronic package that shows a thermal block that is soldered to a pad on the electronic package, in accordance with an embodiment.

Referring now to FIG. 4C, a cross-sectional illustration of an electronic package 400 is shown, in accordance with an additional embodiment. In an embodiment, the electronic package 400 in FIG. 4C is substantially similar to the electronic package 400 in FIG. 4B, with the exception that the interconnect 437 is attached to a pad 403 in the package substrate 407. In an embodiment, the pad 403 is electrically isolated from circuitry of the package substrate 407. In some embodiments, pad 403 is utilized solely for thermal purposes.

Figure 4D:
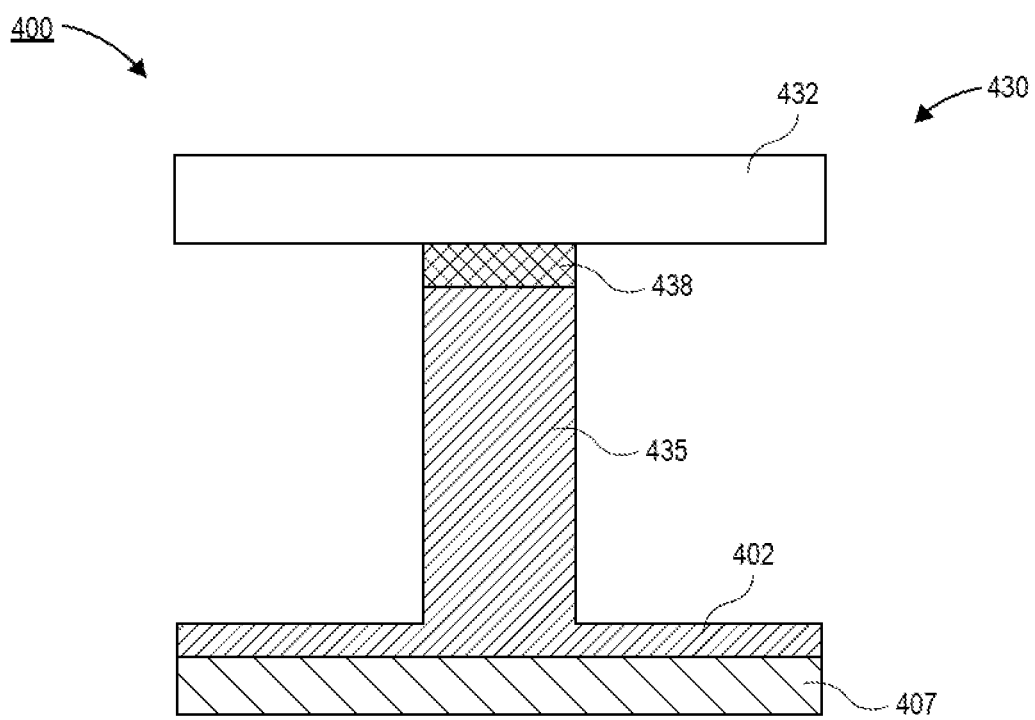
FIG. 4D is a cross-sectional illustration of a portion of an electronic package that shows a thermal block that is a monolithic part of a conductive plane over the package substrate, in accordance with an embodiment.

Referring now to FIG. 4D, a cross-sectional illustration of an electronic package 400 is shown, in accordance with an additional embodiment. In an embodiment, the electronic package 400 may include a thermal plane 402 that extends across a surface of the package substrate 407. For example, the thermal plane 402 may be copper or the like. The use of a thermal plane 402 may improve the lateral spreading of heat within the package substrate 407. In an embodiment, the thermal block 435 may be coupled directly to the thermal plane 402. For example, the thermal block 435 may be plated directly onto the thermal plane 402. That is, there may not be an interconnect between the thermal block 435 and a portion of the package substrate 407 in some embodiments. In an embodiment, the thermal block 435 may be thermally coupled to the main body 432 of the IHS 430 by a TIM 438.

Figure 5A:
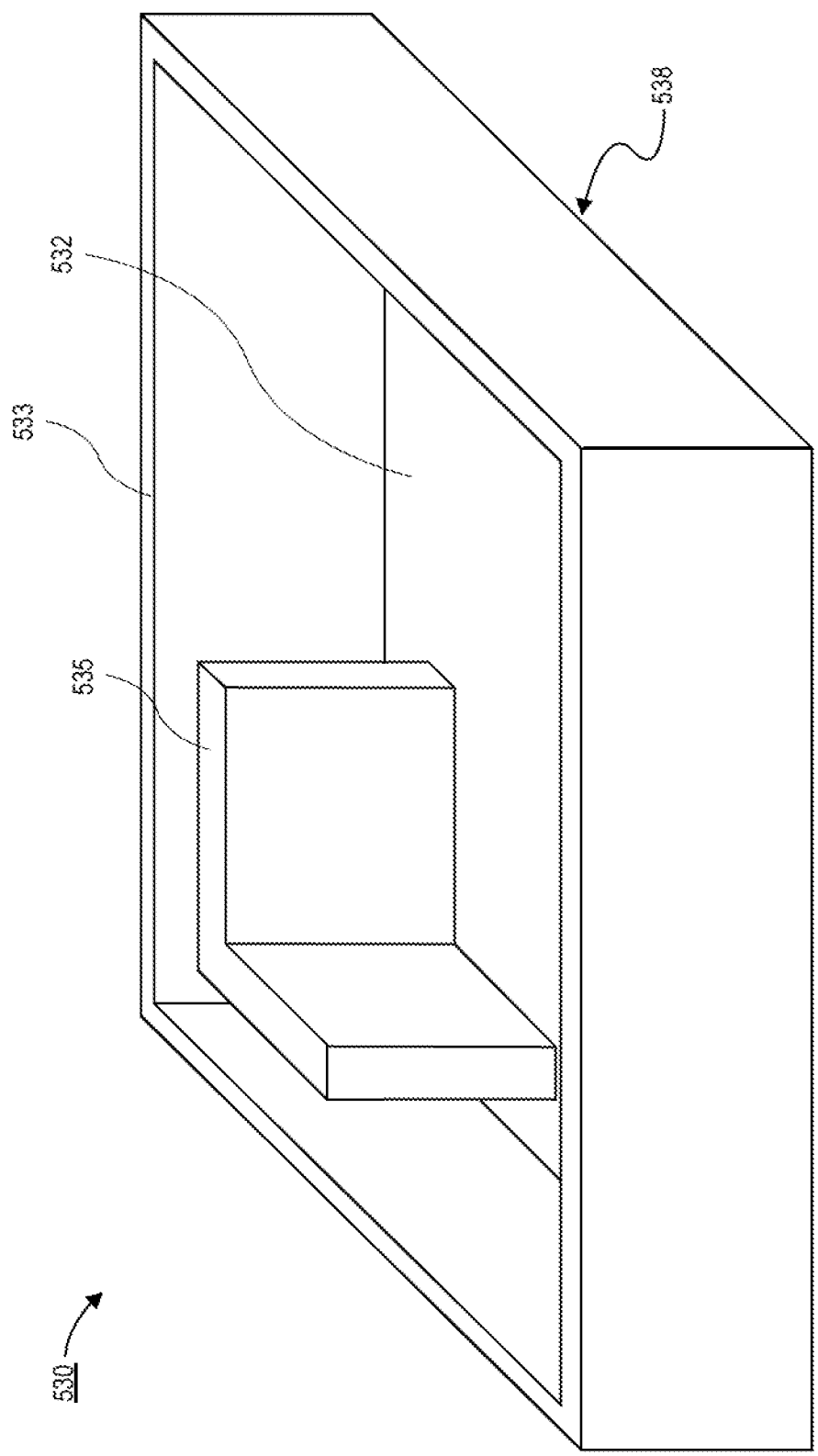
FIG. 5A is a perspective view illustration of an IHS with a thermal block, in accordance with an embodiment.
Figure 5B:
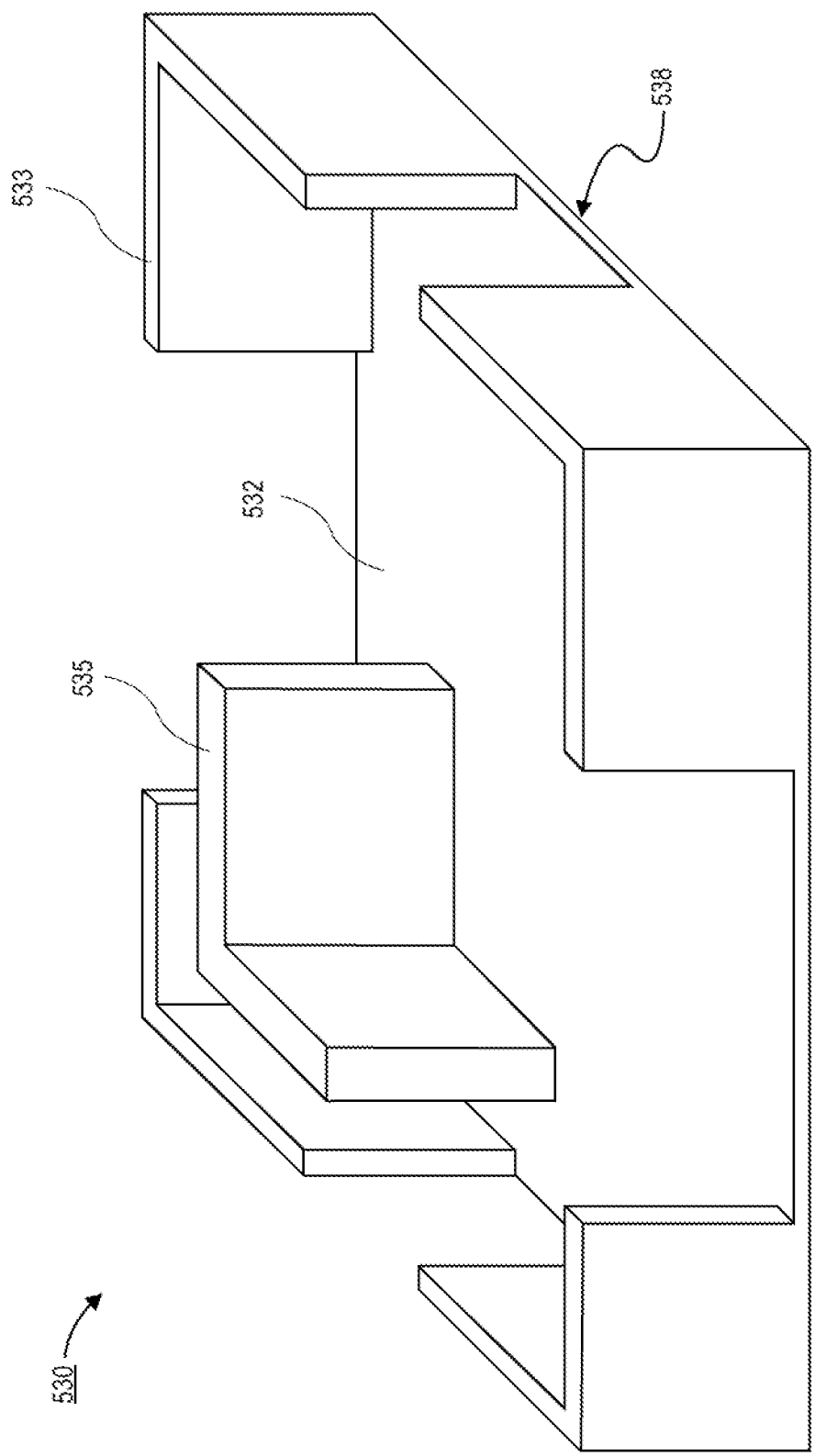
FIG. 5B is a perspective view illustration of an IHS with segmented legs and a thermal block, in accordance with an embodiment.

Referring now to FIGS. 5A and 5B, a pair of perspective view illustrations of various IHS configurations are shown, in accordance with an embodiment. In FIGS. 5A and 5B, the IHS 530 is a single monolithic component that comprises a plurality of different features fabricated from a single body.

Referring now to FIG. 5A, a perspective view illustration of an IHS 530 is shown, in accordance with an embodiment. In an embodiment, the IHS 530 comprises a main body 532. The main body 532 may be a substantially planar sheet of conductive material. In some embodiments, the main body 532 is the portion of the IHS 530 to which the die (not shown) is attached. The main body 532 may have an outer perimeter 538. In an embodiment, one or more legs 533 extend away from the main body 532 at the outer perimeter 538. In the illustrated embodiment, a single leg 533 forms a continuous ring around the outer perimeter 538.

In an embodiment, the IHS 530 may comprise one or more thermal blocks 535. The thermal block 535 may extend out from the main body 532 in the same direction the legs 533 extend. In some embodiments, the height of the thermal block 535 may be substantially the same height as the legs 533. In other embodiments, the height of the thermal block 535 may be less than the height of the legs 533. In an embodiment, the thermal block 535 is positioned within the outer perimeter 538 of the main body.

In an embodiment, the thermal block 535 may have any desired shape. For example, the thermal block 535 in FIG. 5A is shown as having an L-shaped cross-section (when viewed from above). However, it is to be appreciated that the thermal block 535 may have any suitable shape to accommodate one or more dies (not shown), and to provide desired thermal and warpage benefits. For example, the one or more thermal blocks 535 having configurations similar to those described in greater detail above may be used in accordance with various embodiments.

Referring now to FIG. 5B, a perspective view illustration of an IHS 530 is shown, in accordance with an additional embodiment. The IHS 530 in FIG. 5B may be substantially similar to the IHS 530 in FIG. 5A, with the exception that the legs 533 are segmented. That is, a plurality of legs 533 are used to support the main body 532 instead of a single leg 533 that is a ring, as shown in FIG. 5A. The legs 533 in FIG. 5B are shown as being L-shaped, but embodiments are not limited to such configurations. For example, the legs 533 may be rectangular and be positioned along edges of the outer perimeter 538 instead wrapping around corners of the outer perimeter 538.

Figure 6:
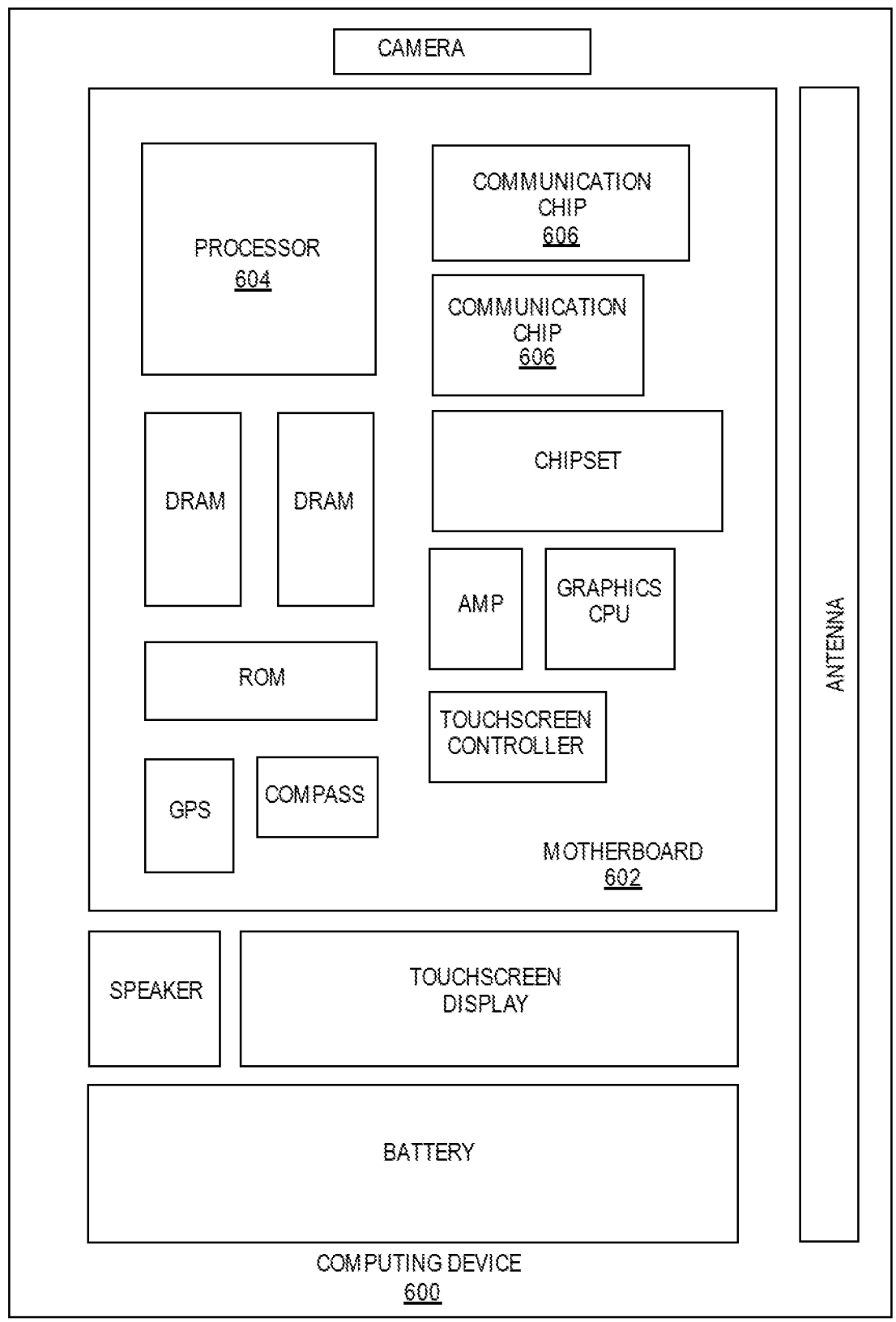
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor 604 may be part of an electronic package that comprises an IHS with one or more thermal blocks, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip 606 may be part of an electronic package that comprises one or more thermal blocks, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a first die electrically coupled to the package substrate; an integrated heat spreader (IHS) that is thermally coupled to a surface of the first die, wherein the IHS comprises: a main body having an outer perimeter; and one or more legs attached to the outer perimeter of the main body, wherein the one or more legs are supported by the package substrate; and a thermal block between the package substrate and the main body of the IHS, wherein the thermal block is within the outer perimeter of the main body.

Example 2: the electronic package of Example 1, wherein the thermal block is a part of the IHS.

Example 3: the electronic package of Example 2, wherein a bottom of the thermal block is attached to the package substrate by a solder.

Example 4: the electronic package of Example 1, wherein the thermal block is a pillar that extends up from the package substrate.

Example 5: the electronic package of Example 4, wherein a top surface of the thermal block is separated from the IHS by a thermal interface material (TIM).

Example 6: the electronic package of Example 4 or Example 5, wherein a bottom surface of the thermal block is attached to a metal plane that extends across a surface of the package substrate.

Example 7: the electronic package of Examples 1-6, wherein the thermal block is adjacent to an edge of the first die.

Example 8: the electronic package of Examples 1-7, wherein the thermal block wraps around a corner of the first die.

Example 9: the electronic package of Examples 1-8, further comprising a plurality of thermal blocks.

Example 10: the electronic package of Example 9, wherein a first thermal block is adjacent to a first edge of the first die and a second thermal block is adjacent to a second edge of the first die.

Examples 11: the electronic package of Examples 1-10, further comprising: a second die, wherein the second die is adjacent to a first edge of the first die, and wherein the thermal block is adjacent to a second edge of the first die that is opposite from the first edge.

Example 12: the electronic package of Example 11, further comprising: a bridge embedded in the package substrate, wherein the bridge electrically couples the first die to the second die.

Example 13: an integrated heat spreader (IHS), comprising: a main body, wherein the main body comprises an outer perimeter; a leg that extends away from the outer perimeter of the main body; and a thermal block that extends away from the main body in the same direction as the leg.

Example 14: the IHS of Example 13, wherein the thermal block is an extruded feature.

Example 15: the IHS of Example 13 or Example 14, wherein a height of the thermal block is substantially equal to a height of the leg.

Example 16: the IHS of Examples 13-15, wherein the leg entirely surrounds the main body.

Example 17: the IHS of Examples 13-15, wherein a plurality of legs extend out from the main body.

Example 18: the IHS of Examples 13-17, further comprising: a plurality of thermal blocks.

Example 19: the IHS of Examples 13-18, wherein the thermal block is rectangular.

Example 20: the IHS of Examples 13-19, wherein the thermal block is L-shaped.

Example 21: an electronic system, comprising: a board; a package substrate electrically coupled to the board; a die electrically coupled to the package substrate; an integrated heat spreader (IHS) that is separated from the die by a first thermal interface material (TIM); and a thermal block between the IHS and the package substrate.

Example 22: the electronic system of Example 21, further comprising: a heat sink thermally coupled to the IHS by a second TIM.

Example 23: the electronic system of Example 21 or Example 22, wherein the thermal block is attached to the IHS by a second TIM.

Example 24: the electronic system of Example 21 or Example 22, wherein the thermal block is an extruded member from the IHS.

Example 25: the electronic system of Examples 21-24, wherein the thermal block is attached to a conductive plane on a surface of the package substrate.

What is claimed is:

1. An electronic package, comprising:
   a package substrate;
   a die over the package substrate, the die having a top side above a bottom side, a first sidewall between the top side and the bottom side, and a second sidewall between the top side and the bottom side, the second sidewall laterally opposite the first sidewall;
   a plurality of copper bumps on the bottom side of the die, the plurality of copper bumps vertically between the package substrate and the die;
   a first discrete thermal block over the package substrate, the first discrete thermal block laterally spaced apart from the first sidewall of the die;
   a second discrete thermal block over the package substrate, the second discrete thermal block laterally spaced apart from the second sidewall of the die;
   a heat sink vertically over the first discrete thermal block, vertically over the die, and vertically over the second discrete thermal block, the heat sink extending laterally beyond outermost sidewalls of the first discrete thermal block and the second discrete thermal block; and
   an interface material vertically between the heat sink and the first discrete thermal block, vertically between the heat sink and the die, and vertically between the heat sink and the second discrete thermal block.

2. The electronic package of claim 1, further comprising: a second die over the package substrate.

3. The electronic package of claim 2, wherein the second die is laterally spaced apart from the die.

4. The electronic package of claim 1, further comprising: interconnects vertically beneath the first discrete thermal block and the second discrete thermal block.

5. The electronic package of claim 1, wherein the first discrete thermal block has a sidewall co-extensive with the first sidewall of the die, and wherein the second discrete thermal block has a sidewall co-extensive with the second sidewall of the die.

6. The electronic package of claim 1, wherein the first discrete thermal block and the second discrete thermal block comprise a metal.

7. The electronic package of claim 1, wherein the interface material is a thermal interface material.

8. The electronic package of claim 1, further comprising:
   a board, wherein the package substrate is coupled to the board.

9. An electronic package, comprising:
   a package substrate;
   a die over the package substrate, the die having a top side above a bottom side, a first sidewall between the top side and the bottom side, and a second sidewall between the top side and the bottom side, the second sidewall laterally opposite the first sidewall;
   a plurality of copper bumps on the bottom side of the die, the plurality of copper bumps vertically between the package substrate and the die;
   a first discrete thermal block over the package substrate, the first discrete thermal block laterally spaced apart from the first sidewall of the die;
   a second discrete thermal block over the package substrate, the second discrete thermal block laterally spaced apart from the second sidewall of the die;
   an integrated heat spreader vertically over the first discrete thermal block, vertically over the die, and vertically over the second discrete thermal block;
   a first interface material vertically between the integrated heat spreader and the die;
   a heat sink vertically over the integrated heat spreader, the heat sink extending laterally beyond outermost sidewalls of the first discrete thermal block and the second discrete thermal block; and
   a second interface material vertically between the heat sink and the integrated heat spreader.

10. The electronic package of claim 9, further comprising: a second die over the package substrate.

11. The electronic package of claim 10, wherein the second die is laterally spaced apart from the die.

12. The electronic package of claim 9, further comprising: interconnects vertically beneath the first discrete thermal block and the second discrete thermal block.

13. The electronic package of claim 9, wherein the first discrete thermal block has a sidewall co-extensive with the first sidewall of the die, and wherein the second discrete thermal block has a sidewall co-extensive with the second sidewall of the die.

14. The electronic package of claim 9, wherein the first discrete thermal block and the second discrete thermal block comprise a metal.

15. The electronic package of claim 9, wherein the first interface material is a first thermal interface material, and wherein the second interface material is a second thermal interface material.

16. The electronic package of claim 9, further comprising:
   a board, wherein the package substrate is coupled to the board.

17. An electronic package, comprising:
   a package substrate;
   a first die over the package substrate;
   a second die over the package substrate;
   a plurality of interconnects vertically between the package substrate and the first die;

a first component over the package substrate, the first component laterally spaced apart from a first side of the first die;

a second component over the package substrate, the second component laterally spaced apart from a second side of the first die, the second side laterally opposite the first side;

a heat sink vertically over the first component, vertically over the first die, vertically over the second die, and vertically over the second component, the heat sink extending laterally beyond outermost sidewalls of the first component and the second component; and an interface material vertically between the heat sink and the first component, vertically between the heat sink and the first die, vertically between the heat sink and the second die, and vertically between the heat sink and the second component, wherein the interface material extends laterally beyond the outermost sidewalls of the first component and the second component.

18. The electronic package of claim 17, wherein the second die is laterally spaced apart from the first die.

19. The electronic package of claim 17, further comprising:
   interconnects vertically beneath the first component and the second component.

20. The electronic package of claim 17, wherein the first component and the second component comprise a metal, and wherein the interface material is a thermal interface material.

\* \* \* \* \*